(12) United States Patent
Usui et al.

(10) Patent No.: US 11,131,928 B2
(45) Date of Patent: Sep. 28, 2021

(54) RESIST UNDERLAYER FILM FORMING COMPOSITION WHICH CONTAINS COMPOUND HAVING GLYCOLURIL SKELETON AS ADDITIVE

(71) Applicant: NISSAN CHEMICAL CORPORATION, Tokyo (JP)

(72) Inventors: Yuki Usui, Toyama (JP); Takahiro Kishioka, Toyama (JP); Yasushi Sakaida, Toyama (JP); Hiroto Ogata, Toyama (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 163 days.

(21) Appl. No.: 16/088,440

(22) PCT Filed: Mar. 29, 2017

(86) PCT No.: PCT/JP2017/012902
§ 371 (c)(1),
(2) Date: Sep. 25, 2018

(87) PCT Pub. No.: WO2017/170696
PCT Pub. Date: Oct. 5, 2017

(65) Prior Publication Data
US 2019/0086806 A1    Mar. 21, 2019

(30) Foreign Application Priority Data
Mar. 30, 2016    (JP) .............................. JP2016-067996

(51) Int. Cl.
| G03F 7/11 | (2006.01) |
| C08K 5/3445 | (2006.01) |
| C08L 63/00 | (2006.01) |
| C08K 5/00 | (2006.01) |
| G03F 7/40 | (2006.01) |

(52) U.S. Cl.
CPC .............. *G03F 7/11* (2013.01); *C08K 5/0025* (2013.01); *C08K 5/3445* (2013.01); *C08L 63/00* (2013.01); *G03F 7/40* (2013.01)

(58) Field of Classification Search
CPC ....................................................... G03F 7/00
See application file for complete search history.

(56) References Cited

U.S. PATENT DOCUMENTS

| 10,429,739 | B2 | 10/2019 | Kori et al. | |
| 10,472,461 | B2* | 11/2019 | Arai .................. | G02B 19/0076 |
| 2004/0197709 | A1 | 10/2004 | Arase et al. | |
| 2009/0317740 | A1* | 12/2009 | Hiroi ................. | C08G 63/6856 |
| | | | | 430/270.1 |
| 2015/0087155 | A1 | 3/2015 | Endo et al. | |
| 2015/0362838 | A1 | 12/2015 | Endo et al. | |
| 2016/0289237 | A1* | 10/2016 | Kumano ............... | C08G 59/66 |
| 2016/0297951 | A1 | 10/2016 | Kumano et al. | |
| 2017/0183531 | A1 | 6/2017 | Kori et al. | |

FOREIGN PATENT DOCUMENTS

| JP | 2004-126161 | A | | 4/2004 | | |
| JP | 2007084502 | A | * | 4/2007 | | |
| JP | 2009-251130 | A | | 10/2009 | | |
| JP | 2009251130 | A | * | 10/2009 | | |
| JP | 2010-026221 | A | | 2/2010 | | |
| JP | 2013-073125 | A | | 4/2013 | | |
| JP | 2017-119670 | | | 6/2017 | | |
| WO | 2003/017002 | A1 | | 2/2003 | | |
| WO | 2013/168610 | A1 | | 11/2013 | | |
| WO | 2015/076399 | A1 | | 5/2015 | | |
| WO | WO-2015080241 | A1 | * | 6/2015 | ............ | C09J 163/00 |
| WO | WO-2016143815 | A1 | * | 9/2016 | ............ | H01L 27/146 |

OTHER PUBLICATIONS

Japanese Patent Office, International Search Report in International Patent Application No. PCT/JP2017/012902 (dated Jul. 4, 2017).
Japanese Patent Office, Notice of Reasons for Refusal in Japanese Patent Application No. 2018-509340 (dated Feb. 4, 2020).

* cited by examiner

*Primary Examiner* — Chanceity N Robinson
(74) *Attorney, Agent, or Firm* — Leydig, Voit & Mayer, Ltd.

(57) ABSTRACT

The invention provides a resist underlayer film forming composition which contains a compound having a glycoluril skeleton and which prevents collapse of a resist pattern formed on a substrate in a lithography process during semiconductor production; a resist underlayer film which uses this composition; and a method for producing a semiconductor device. The compound is of formula (1-1), wherein each of $R^1$-$R^4$ represents a $C_2$-$C_{10}$ alkyl group wherein a hydrogen atom is substituted by at least one substituent selected from the group consisting of a hydroxy group, a thiol group, a carboxyl group, $C_1$-$C_5$ alkoxyethyl groups, $C_1$-$C_5$ alkylsulfanyl groups and organic groups containing an ester bond, or a $C_2$-$C_{10}$ alkenyl group; the $R^1$-$R^4$ moieties may be the same as or different from each other; and each of $R^5$ and $R^6$ represents a hydrogen atom or a group selected from among $C_1$-$C_{10}$ alkyl groups and a phenyl group.

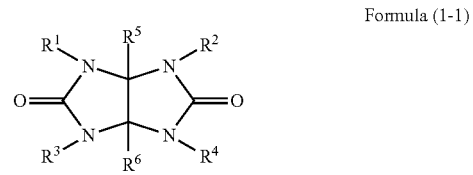

Formula (1-1)

14 Claims, No Drawings

RESIST UNDERLAYER FILM FORMING COMPOSITION WHICH CONTAINS COMPOUND HAVING GLYCOLURIL SKELETON AS ADDITIVE

CROSS-REFERENCE TO RELATED APPLICATIONS

This patent application is the U.S. national phase of International Patent Application No. PCT/JP2017/012902, filed Mar. 29, 2017, which claims the benefit of Japanese Patent Application No. 2016-067996, filed on Mar. 30, 2016, which are incorporated by reference in their entireties herein.

TECHNICAL FIELD

The present invention relates to a resist underlayer film forming composition comprising a compound having a glycoluril skeleton as an additive. More particularly, the present invention relates to a resist underlayer film forming composition, which has a function enhanced by the additive of preventing the resist pattern formed on a substrate from suffering pattern collapse in a lithography process for producing a semiconductor device, that is, an improved adhesion to the resist pattern; a resist underlayer film using the composition; and a method for producing a semiconductor device.

BACKGROUND ART

In KrF lithography, ArF lithography, ArF immersion lithography, and extreme ultraviolet (EUV) lithography, the fabrication dimension for resist line width is required to be scaled down. In the formation of such very fine resist patterns, reduced contact area of the resist pattern with a substrate and increased aspect ratio (height of the resist pattern/line width of the resist pattern) would cause undesirable collapse of the resist pattern. For removing the problem, the resist underlayer film (antireflection film) in contact with the resist pattern is required to have a high adhesion to the resist pattern so as not to cause collapse of the resist pattern.

With respect to an antireflection film as a resist underlayer film, an antireflection film forming composition containing a compound having an alkoxymethyl group having a glycoluril, such as 1,3,4,6-tetrakis(2-hydroxymethyl)glycoluril, as a skeleton has been reported (Patent Literature 1).

On the other hand, it has been reported that use of a lactone structure as a constituent component of a resist underlayer film forming composition in order to achieve a high adhesion to a resist pattern gave a resist underlayer film with an improved adhesion to the resultant resist pattern. That is, it has been reported that use of a structure containing a polar moiety such as a lactone structure as a constituent component of a resist underlayer film forming composition gave an improved adhesion to a resist pattern and that it prevented collapse of a resist pattern even in a fine resist pattern (Patent Document 2).

An example of the method of achieving a high adhesion to a resist pattern includes a method of controlling the chemical state of the interface between a resist and a resist underlayer film. An acidic chemical state of the interface between a positive resist and a resist underlayer film gives an undercut resist pattern form and a reduced contact area of the resist pattern with the underlayer film, then the resist pattern is likely to collapse. It has been reported that a basic chemical state of the interface between a resist and a resist underlayer film, on the other hand, permitted preventing the resist pattern from becoming an undercut form, and that it resulted in a stronger adhesion than to a resist pattern obtained by introducing such a polar site as a lactone structure (Patent Literature 3).

CITATION LIST

Patent Literature

Patent Literature 1: JP 2004-126161 A
Patent Literature 2: WO 2003/017002 A1
Patent Literature 3: WO 2013/168610 A1

SUMMARY OF INVENTION

Technical Problem

However, in lithography processes required to form even finer resist patterns, such as KrF lithography, ArF lithography, ArF immersion lithography, and extreme ultraviolet (EUV) lithography, the resist pattern cannot be satisfactorily prevented from collapsing only by the method of incorporating a lactone structure as a constituent component into the resist underlayer film forming composition.

Moreover, the method of controlling a resist underlayer film in a basic state to prevent the form of resist pattern from becoming an undercut form has problems of inhibition of crosslinking and occurrence of drastic change of the physical properties of the film, especially for a resist underlayer film which undergoes crosslinking due to an acid.

Furthermore, such methods as disclosed in Patent Literatures 2 and 3 require modifying the construction of the polymers, and cause prolonged time for sample preparation and evaluation together with an increased cost therefor. Therefore, a simpler and more effective method has been desired as a substitute for the above methods.

Patent Literature 1, which reports a resist underlayer film (antireflection film), is silent as to resist pattern collapse. It teaches incorporation of compounds having a glycoluril as a skeleton as a part of polymer or as a crosslinking agent, but it fails to mention incorporation as an additive of a compound having a glycoluril skeleton which is inert for crosslinking reaction.

Accordingly, an object of the present invention is to provide a resist underlayer film forming composition comprising a compound having a glycoluril skeleton (this compound is regarded as an adhesive auxiliary for the resist) for controlling collapse of a resist pattern to be formed on a resist underlayer film without adding a basic substance.

Solution to Problem

The present invention encompasses the followings.
[1] An additive for a resist underlayer film forming composition, the additive comprising a compound represented by the following formula (1-1):

[Chemical formula 1]

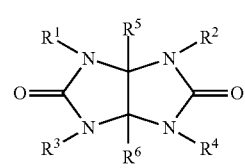

Formula (1-1)

wherein each of $R^1$ to $R^4$, which may be the same or different, is a $C_2$-$C_{10}$ alkenyl group or a $C_2$-$C_{10}$ alkyl group substituted with at least one substituent selected from the group consisting of a hydroxyl group, a thiol group, a carboxyl group, a $C_1$-$C_5$ alkoxyethyl group, a $C_1$-$C_5$ alkylsulfanyl group and an organic group having an ester linkage; and each of $R^5$ and $R^6$, which may be the same or different, represents a hydrogen atom or a group selected from a $C_1$-$C_{10}$ alkyl group and a phenyl group.

[2] The additive according to item [1] above, wherein each of $R^1$ to $R^4$ is a $C_2$-$C_{10}$ alkenyl group or a $C_2$-$C_{10}$ alkyl group substituted with a hydroxyl group or a thiol group.

[3] A resist underlayer film forming composition comprising the additive according to item [1] or [2] above.

[4] The composition according to item [3] above, further comprising:
(a) a polymer, and
(b) a solvent.

[5] The composition according to item [4] above, wherein the polymer (a) has a structure of the following formula (2):

[Chemical formula 2]

Formula (2)

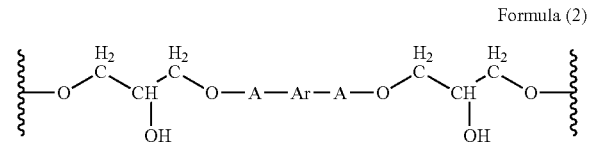

wherein A represents a direct bond or —C(=O)—; and Ar represents a benzene, naphthalene or anthracene ring, which is optionally substituted with a $C_1$-$C_6$ alkyl group, a halogen atom, a hydroxyl group, a carboxyl group, an amino group, a $C_1$-$C_6$ alkoxy group, a $C_1$-$C_6$ alkylthio group, a cyano group, an acetyl group, an acetyloxy group, a $C_1$-$C_6$ alkoxycarbonyl group, a nitro group, a nitroso group, an amide group, an imide group, a $C_1$-$C_6$ alkoxysulfonyl group or a sulfonamide group.

[6] The composition according to any one of items [3] to [5] above, further comprising a crosslinking agent and a crosslinking catalyst.

[7] A resist underlayer film comprising the additive according to item [1] or [2] above.

[8] A resist underlayer film obtained by applying the resist underlayer film forming composition according to any one of items [3] to [6] above onto a semiconductor substrate and baking the applied composition.

[9] A method for forming a resist pattern for use in production of a semiconductor, the method comprising the step of applying the resist underlayer film forming composition according to any one of items [3] to [6] above onto a semiconductor substrate and baking the applied composition to form a resist underlayer film.

[10] A method for producing a semiconductor device, comprising the steps of: forming on a semiconductor substrate an underlayer film from the resist underlayer film forming composition according to any one of items [3] to [6] above; forming a resist film on the underlayer film; irradiating the resist film with a light or an electron beam and subjecting the resultant resist film to development to form a resist pattern; etching the underlayer film with the resist pattern; and processing the semiconductor substrate using the patterned underlayer film.

[11] A method for preventing resist pattern collapse, comprising allowing the additive according to item [1] or [2] above to be present in a resist underlayer film.

[12] Use of the resist underlayer film forming composition according to any one of items [3] to [6] above for forming a resist underlayer film.

[13] Use of the resist underlayer film forming composition according to any one of items [3] to [6] above for producing a semiconductor device.

[14] A method for forming a resist underlayer film, comprising the step of applying the resist underlayer film forming composition according to any one of items [3] to [6] above onto a semiconductor substrate and baking the applied composition.

Advantageous Effects of Invention

The above-mentioned problems can be solved by mixing a compound having a glycoluril skeleton, which does not function (react) as a crosslinking agent or is poor in function as a crosslinking agent, as an additive into a resist underlayer film forming composition. Although not bound by a theory, the additive of the present invention is poor in function (reactivity) as a crosslinking agent, unlike 1,3,4,6-tetrakis (methoxymethyl)glycoluril or the like conventionally known to be used as a crosslinking agent for a resist underlayer film. It is considered that the additive is locally disposed on the surface of the resist underlayer film. It is considered that the localization of a structure containing a polar site, such as a glycoluril structure, on the interface between the resist and the resist underlayer film would change the physical properties of the surface of the resist underlayer film, and would result in an improved adhesion to the resist pattern and control of the resist pattern form.

The fact that the additive of the present invention does not function (react) as a crosslinking agent can be confirmed as follows, with reference to the combinations of the polymer described below, the additive according to the present invention and the solvent described below, or with reference to the combinations of the polymer, the additive, the below-described crosslinking catalyst and the solvent, for example. A composition is prepared in such a manner that the additive is mixed in an amount of 1 to 30% by weight based on the weight of the polymer, that the crosslinking catalyst is mixed in an amount of 0.1 to 3% by weight based on the weight of the polymer, and that the solvent is added so that the solid content (content of the component remaining after removing the solvent) becomes 1 to 5% by mass. Then, in accordance with the method in Examples (Test for dissolution into a photoresist solvent), an initial thickness of a film and a thickness of the film after immersion are evaluated. When the thickness after immersion is 25% or less, preferably 20% or less, most preferably 15% or less of the initial thickness of the film, then the additive can be defined as not function (react) as a crosslinking agent. In the above evaluation, the resist underlayer film forming composition may be baked at a temperature of 120 to 215° C., preferably 150 to 215° C. The baking may be conducted for a period of time of 0.3 to 3 minutes, preferably 0.3 to 1 minute.

DESCRIPTION OF EMBODIMENTS

1. Additive For a Resist Underlayer Film Forming Composition

The additive for a resist underlayer film forming composition of the present invention may be represented by the following formula (1-1):

[Chemical formula 3]

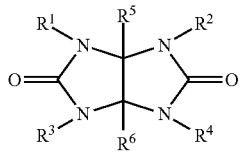

Formula (1-1)

wherein each of $R^1$ to $R^4$, which may be the same or different, is a $C_2$-$C_{10}$ alkyl group substituted with at least one substituent selected from the group consisting of a hydroxyl group, a thiol group, a carboxyl group, a $C_1$-$C_5$ alkoxyethyl group, a $C_1$-$C_5$ alkylsulfanyl group and an organic group having an ester linkage; and each of $R^5$ and $R^6$ represents a hydrogen atom, or a group selected from a $C_1$-$C_{10}$ alkyl group and a phenyl group.

Specific examples of $C_1$-$C_5$ alkoxyethyl groups include a methoxyethyl group, an ethoxyethyl group, a n-propoxyethyl group, an i-propoxyethyl group, a n-butyloxyethyl group, an i-butyloxyethyl group, and a sec-butyloxyethyl group, but are not limited to these groups.

Specific examples of $C_1$-$C_5$ alkylsulfanyl groups include a methylethylsulfide group, a diethylsulfide group, a n-propylethylsulfide group, an i-propylethylsulfide group, a n-butylethylsulfide group, an i-butylethylsulfide group, and a sec-butylethylsulfide group, but are not limited to these groups.

Specific examples of $C_2$-$C_{10}$ alkyl groups include an ethyl group, a n-propyl group, an i-propyl group, a n-butyl group, an i-butyl group, a s-butyl group, a t-butyl group, a n-pentyl group, a 1-methyl-n-butyl group, a 2-methyl-n-butyl group, a 3-methyl-n-butyl group, a 1,1-dimethyl-n-propyl group, a 1,2-dimethyl-n-propyl group, a 2,2-dimethyl-n-propyl group, a 1-ethyl-n-propyl group, a n-hexyl group, a 1-methyl-n-pentyl group, a 2-methyl-n-pentyl group, a 3-methyl-n-pentyl group, a 4-methyl-n-pentyl group, a 1,1-dimethyl-n-butyl group, a 1,2-dimethyl-n-butyl group, a 1,3-dimethyl-n-butyl group, a 2,2-dimethyl-n-butyl group, a 2,3-dimethyl-n-butyl group, a 3,3-dimethyl-n-butyl group, a 1-ethyl-n-butyl group, a 2-ethyl-n-butyl group, a 1,1,2-trimethyl-n-propyl group, a 1,2,2-trimethyl-n-propyl group, a 1-ethyl-1-methyl-n-propyl group, and a 1-ethyl-2-methyl-n-propyl group. Further, a cyclic alkyl group can be used, and examples of cyclic alkyl groups having 3 to 10 carbon atoms include a cyclopropyl group, a cyclobutyl group, a 1-methyl-cyclopropyl group, a 2-methyl-cyclopropyl group, a cyclopentyl group, a 1-methyl-cyclobutyl group, a 2-methyl-cyclobutyl group, a 3-methyl-cyclobutyl group, a 1,2-dimethyl-cyclopropyl group, a 2,3-dimethyl-cyclopropyl group, a 1-ethyl-cyclopropyl group, a 2-ethyl-cyclopropyl group, a cyclohexyl group, a 1-methyl-cyclopentyl group, a 2-methyl-cyclopentyl group, a 3-methyl-cyclopentyl group, a 1-ethyl-cyclobutyl group, a 2-ethyl-cyclobutyl group, a 3-ethyl-cyclobutyl group, a 1,2-dimethyl-cyclobutyl group, a 1,3-dimethyl-cyclobutyl group, a 2,2-dimethyl-cyclobutyl group, a 2,3-dimethyl-cyclobutyl group, a 2,4-dimethyl-cyclobutyl group, a 3,3-dimethyl-cyclobutyl group, a 1-n-propyl-cyclopropyl group, a 2-n-propyl-cyclopropyl group, a -i-propyl-cyclopropyl group, a 2-i-propyl-cyclopropyl group, a 1,2,2-trimethyl-cyclopropyl group, a 1,2,3-trimethyl-cyclopropyl group, a 2,2,3-trimethyl-cyclopropyl group, a 1-ethyl-2-methyl-cyclopropyl group, a 2-ethyl-l-methyl-cyclopropyl group, a 2-ethyl-2-methyl-cyclopropyl group, and a 2-ethyl-3-methyl-cyclopropyl group, but are not limited to these groups.

Examples of organic groups having an ester linkage include a methylethyl ester group, a diethyl ester group, a n-propylethyl ester group, an i-propylethyl ester group, a n-butylethyl ester group, an i-butylethyl ester group, and a sec-butylethyl ester group, but are not limited to these groups.

Specific examples of $C_1$-$C_{10}$ alkyl groups include a methyl group as well as the above-mentioned specific examples of $C_2$-$C_{10}$ alkyl groups.

Each of $R^1$ to $R^4$ is preferably a $C_2$-$C_{10}$ alkyl group substituted with a hydroxyl group or a thiol group; preferably a $C_2$-$C_{10}$ alkyl group substituted with a hydroxyl group; more preferably a $C_2$-$C_5$ alkyl group substituted with a hydroxyl group. $R^1$ to $R^4$ may be the same or different, but are preferably the same.

Each of $R^5$ and $R^6$ preferably represents a hydrogen atom or a group selected from $C_1$-$C_{10}$ alkyls; more preferably represents a hydrogen atom or a group selected from $C_1$-$C_5$ alkyls. $R^5$ and $R^6$ may be the same or different, but are preferably the same.

The additive for a resist underlayer film forming composition of the present invention may be represented by the following formula (1-1):

[Chemical formula 4]

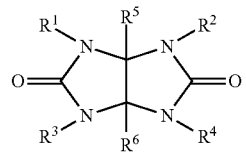

Formula (1-1)

wherein each of $R^1$ to $R^4$, which may be the same or different, is an unsubstituted $C_2$-$C_{10}$ alkenyl group; and each of $R^5$ and $R^6$ represents a hydrogen atom, or a group selected from a $C_1$-$C_{10}$ alkyl group and a phenyl group.

Specific examples of $C_2$-$C_{10}$ alkenyl groups include an ethenyl group (vinyl group), a 1-propenyl group, a 2-propenyl group, a 1-methyl-1-ethenyl group, a 1-butenyl group, a 2-butenyl group, a 3-butenyl group, a 2-methyl-1-propenyl group, a 2-methyl-2-propenyl group, a 1-ethylethenyl group, a 1-methyl-1-propenyl group, a 1-methyl-2-propenyl group, a 1-pentenyl group, a 2-pentenyl group, a 3-pentenyl group, a 4-pentenyl group, a 1-n-propylethenyl group, a 1-methyl-1-butenyl group, a 1-methyl-2-butenyl group, a 1-methyl-3-butenyl group, a 2-ethyl-2-propenyl group, a 2-methyl-1-butenyl group, a 2-methyl-2-butenyl group, a 2-methyl-3-butenyl group, a 3-methyl-1-butenyl group, a 3-methyl-2-butenyl group, a 3-methyl-3-butenyl group, a 1,1-dimethyl-2-propenyl group, a 1-i-propylethenyl group, a 1,2-dimethyl-1-propenyl group, a 1,2-dimethyl-2-propenyl group, a 1-cyclopentenyl group, a 2-cyclopentenyl group, a 3-cyclopentenyl group, a 1-hexenyl group, a 2-hexenyl group, a 3-hexenyl group, a 4-hexenyl group, a 5-hexenyl group, a 1-methyl-1-pentenyl group, a 1-methyl-2-pentenyl group, a 1-methyl-3-pentenyl group, a 1-methyl-4-pentenyl group, a 1-n-butylethenyl group, a 2-methyl-1-pentenyl group, a 2-methyl-2-pentenyl group, a 2-methyl-3-pentenyl group, a 2-methyl-4-pentenyl group, a 2-n-propyl-2-propenyl group, a 3-methyl-1-pentenyl group, a 3-methyl-2-pentenyl group, a 3-methyl-3-pentenyl group, a 3-methyl-4- pentenyl group, a 3-ethyl-3-butenyl group, a 4-methyl-1-pentenyl group, a 4-methyl-2-pentenyl group, a 4-methyl-3-pentenyl group, a 4-methyl-4-pentenyl group, a 1,1-dimethyl-2-butenyl group, a 1,1-dimethyl-3-butenyl group, a 1,2-dimethyl-1-butenyl group, a 1,2-dimethyl-2-butenyl group, a 1,2-dimethyl-3-butenyl group, a 1-methyl-2-ethyl-2-propenyl group, a 1-s-butylethenyl group, a 1,3-dimethyl-1-butenyl group, a 1,3-dimethyl-2-butenyl group, a 1,3-dimethyl-3-butenyl group, a 1-i-butylethenyl group, a 2,2-dimethyl-3-butenyl group, a 2,3-dimethyl-1-butenyl group, a 2,3-dimethyl-2-butenyl group, a 2,3-dimethyl-3-butenyl group, a 2-i-propyl-2-propenyl group, a 3,3-dimethyl-1-butenyl group, a 1-ethyl-1-butenyl group, a 1-ethyl-2-butenyl group, a 1-ethyl-3-butenyl group, a 1-n-propyl-1-propenyl group, a 1-n-propyl-2-propenyl group, a 2-ethyl-1-butenyl group, a 2-ethyl-2-butenyl group, a 2-ethyl-3-butenyl group, a 1,1,2-trimethyl-2-propenyl group, a 1-t-butylethenyl group, a 1-methyl-1-ethyl-2-propenyl group, a 1-ethyl-2-methyl-1-propenyl group, a 1-ethyl-2-methyl-2-propenyl group, a 1-i-propyl-1-propenyl group, a 1-i-propyl-2-propenyl group, a 1-methyl-2-cyclopentenyl group, a 1-methyl-3-cyclopentenyl group, a 2-methyl-1-cyclopentenyl group, a 2-methyl-2-cyclopentenyl group, a 2-methyl-3-cyclopentenyl group, a 2-methyl-4-cyclopentenyl group, a 2-methyl-5-cyclopentenyl group, a 2-methylene-cyclopentyl group, a 3-methyl-1-cyclopentenyl group, a 3-methyl-2-cyclopentenyl group, a 3-methyl-3-cyclopentenyl group, a 3-methyl-4-cyclopentenyl group, a 3-methyl-5-cyclopentenyl group, a 3-methylene-cyclopentyl group, a 1-cyclohexenyl group, a 2-cyclohexenyl group, and a 3-cyclohexenyl group, but are not limited to these groups.

Each of $R^1$ to $R^4$ is more preferably a $C_2$-$C_5$ alkenyl group. $R^1$ to $R^4$ may be the same or different, but are preferably the same.

Each of $R^5$ and $R^6$ preferably represents a hydrogen atom or a group selected from $C_1$-$C_{10}$ alkyls; more preferably represents a hydrogen atom or a group selected from $C_1$-$C_5$ alkyls. $R^5$ and $R^6$ may be the same or different, but are preferably the same.

Of the additives represented by formula (1-1) for a resist underlayer film forming composition, preferred is a compound of the following formula (1-1-1):

[Chemical formula 5]

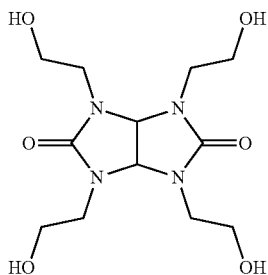

Formula (1-1-1) (1,3,4,6-tetrakis(2-hydroxyethyl)glycoluril);

of the following formula (1-1-2):

[Chemical formula 6]

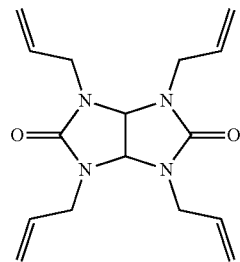

Formula (1-1-2) (1,3,4,6-tetraallyltetrahydroimidazo[4,5-d]imidazole-2,5(1H,3H)-dione);
of the following formula (1-1-3):

[Chemical formula 7]

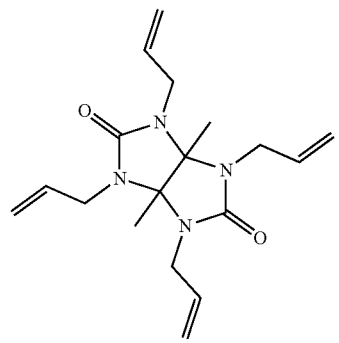

Formula (1-1-3) (1,3,4,6-tetraallyl-3a,6a-dimethyltetrahydroimidazo[4,5-d]imidazole-2,5(1H,3H)-dione);
or of the following formula (1-1-4):

[Chemical formula 8]

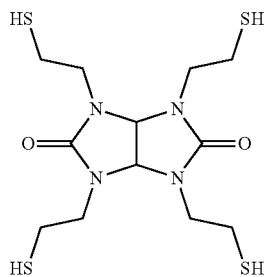

Formula (1-1-4) (1,3,4,6-tetrakis(2-mercaptoethyl)glycoluril).
The compound of formula (1-1-1) or formula (1-1-2) is most preferred.

2. Resist Underlayer Film Forming Composition

Next, the resist underlayer film forming composition of the present invention comprising a compound having a glycoluril skeleton as an additive is described. The composition of the present invention is a resist underlayer film forming composition that can be used in a lithography process for semiconductor device production, which is conducted using an irradiation light having a short wavelength, particularly using a KrF excimer laser (wavelength: 248 nm), an ArF excimer laser (wavelength: 193 nm), or an extreme ultraviolet light (EUV, wavelength: 13.5 nm) as an irradiation light.

The resist underlayer film forming composition of the present invention comprises the additive represented by formula (1-1) above for resist underlayer film forming composition. Usually, the composition further comprises (a) a polymer and (b) a solvent. As an optional component, the composition contains, for example, a crosslinking agent, a crosslinking catalyst, or a surfactant. The resist underlayer film forming composition of the present invention has a solid content of, for example, 0.5 to 50% by mass, or, for example, 1 to 30% by mass. The solid content indicates a content of the solids remaining after removing the solvent component from the all components of the resist underlayer film forming composition.

The resist underlayer film forming composition of the present invention contains the additive represented by formula (1-1) above for resist underlayer film forming composition in an amount of 0.1% by mass or more, for example, 0.5 to 50% by mass, 1 to 30% by mass, 2 to 30% by mass, 3 to 30% by mass, 2 to 20% by mass, 3 to 10% by mass, or 3 to 5% by mass, in terms of solid content.

2.1. (a) Polymer

By using a polymer, it is possible to control, the dry etching rate (reduction of the film thickness per unit time) for and the attenuation coefficient and refractive index of the resist underlayer film formed from the resist underlayer film forming composition of the present invention.

There is no particular limitation with respect to the polymer, and various organic polymers can be used. For example, addition polymerized polymers, polycondensed polymers, and ring-opening polymerized polymers, such as polyester, polystyrene, polyimide, an acrylic polymer, a methacrylic polymer, polyvinyl ether, phenolic novolak, naphthol novolak, polyether, polyamide, and polycarbonate, can be used. Organic polymers having an aromatic ring structure that functions as a light absorbing site, such as a benzene ring, a naphthalene ring, an anthracene ring, a triazine ring, a quinoline ring, or a quinoxaline ring, may preferably be used.

Examples of such organic polymers include addition polymerized polymers containing a structural unit derived from an addition polymerizable monomer, such as benzyl acrylate, benzyl methacrylate, phenyl acrylate, naphthyl acrylate, anthryl methacrylate, anthrylmethyl methacrylate, styrene, hydroxystyrene, benzylvinyl ether; or N-phenylmaleimide, and polycondensed polymers, such as phenolic novolak and naphthol novolak.

When an addition polymerized polymer is used as the organic polymer, the polymer may be either a homopolymer or a copolymer. In the production of an addition polymerized polymer, an addition polymerizable monomer is used. Examples of such addition polymerizable monomers include acrylic acid, methacrylic acid, acrylate compounds, methacrylate compounds, acrylamide compounds, methacrylamide compounds, vinyl compounds, styrene compounds, maleimide compounds, maleic anhydride, and acrylonitrile.

Examples of the acrylate compounds include methyl acrylate, ethyl acrylate, normalhexyl acrylate, isopropyl acrylate, cyclohexyl acrylate, benzyl acrylate, phenyl acrylate, anthrylmethyl acrylate, 2-hydroxyethyl acrylate, 3-chloro-2-hydroxypropyl acrylate, 2-hydroxypropyl acrylate, 2,2,2-trifluoroethyl acrylate, 2,2,2-trichloroethyl acrylate, 2-bromoethyl acrylate, 4-hydroxybutyl acrylate, 2-methoxyethyl acrylate, tetrahydrofurfuryl acrylate, 2-methyl-2-adamantyl acrylate, 5-acryloyloxy-6-hydroxynorbornene-2-carboxylic-6-lactone, 3-acryloxypropyltriethoxysilane, and glycidyl acrylate.

Examples of the methacrylate compounds include methyl methacrylate, ethyl methacrylate, normalhexyl methacrylate, isopropyl methacrylate, cyclohexyl methacrylate, benzyl methacrylate, phenyl methacrylate, anthrylmethyl methacrylate, 2-hydroxyethyl methacrylate, 2-hydroxypropyl methacrylate, 2,2,2-trifluoroethyl methacrylate, 2,2,2-trichloroethyl methacrylate, 2-bromoethyl methacrylate, 4-hydroxybutyl methacrylate, 2-methoxyethyl methacrylate, tetrahydrofurfuryl methacrylate, 2-methyl-2-adamantyl methacrylate, 5-methacryloyloxy-6-hydroxynorbornene-2-carboxylic-6-lactone, 3-methacryloxypropyltriethoxysilane, glycidyl methacrylate, 2-phenylethyl methacrylate, hydroxyphenyl methacrylate, and bromophenyl methacrylate.

Examples of the acrylamide compounds include acrylamide, N-methylacrylamide, N-ethylacrylamide, N-benzylacrylamide, N-phenylacrylamide, N,N-dimethylacrylamide, and N-anthrylacrylamide.

Examples of the methacrylamide compounds include methacrylamide, N-methylmethacrylamide, N-ethylmethacrylamide, N-benzylmethacrylamide, N-phenylmethacrylamide, N,N-dimethylmethacrylamide, and N-anthrylacrylamide.

Examples of the vinyl compounds include vinyl alcohol, 2-hydroxyethylvinyl ether, methylvinyl ether, ethylvinyl ether, benzylvinyl ether, vinylacetic acid, vinyltrimethoxysilane, 2-chloroethylvinyl ether, 2-methoxyethylvinyl ether, vinylnaphthalene, and vinylanthracene.

Examples of the styrene compounds include styrene, hydroxystyrene, chlorostyrene, bromostyrene, methoxystyrene, cyanostyrene, and acetylstyrene.

Examples of the maleimide compounds include maleimide, N-methylmaleimide, N-phenylmaleimide, N-cyclohexylmaleimide, N-benzylmaleimide, and N-hydroxyethylmaleimide.

When a polycondensed polymer is used as the organic polymer compound, examples of such polymers include polycondensed polymers of a glycol compound and a dicarboxylic acid compound.

Examples of the glycol compounds include diethylene glycol, hexamethylene glycol, and butylene glycol.

Examples of the dicarboxylic acid compounds include aliphatic dicarboxylic acids and aromatic dicarboxylic acids, such as succinic acid, 2,2-dimethylsuccinic acid, adipic acid, terephthalic acid, isophthalic acid, phthalic acid, 3,3'-dithiodipropionic acid, tartaric acid, malic acid, and maleic anhydride.

Further examples include polyesters, polyamides, and polyimides, such as polypyromellitic imide, poly(p-phenyleneterephthalamide), polybutylene terephthalate, and polyethylene terephthalate.

When a ring-opening polymerized polymer is used as the organic polymer compound, examples of such polymers include polycondensed polymers of a diepoxy compound and a dicarboxylic acid compound.

Examples of diepoxy compounds include such compounds as sorbitol polyglycidyl ether, polyglycerol polyglycidyl ether, pentaerythritol polyglycidyl ether, diglycerol polyglycidyl ether, glycerol polyglycidyl ether, trimethylolpropane polyglycidyl ether, neopentyl glycol diglycidyl ether, 1,6-hexanediol diglycidyl ether, and those represented by the following formulae [3-1] to [3-16]:

[Chemical formula 9]

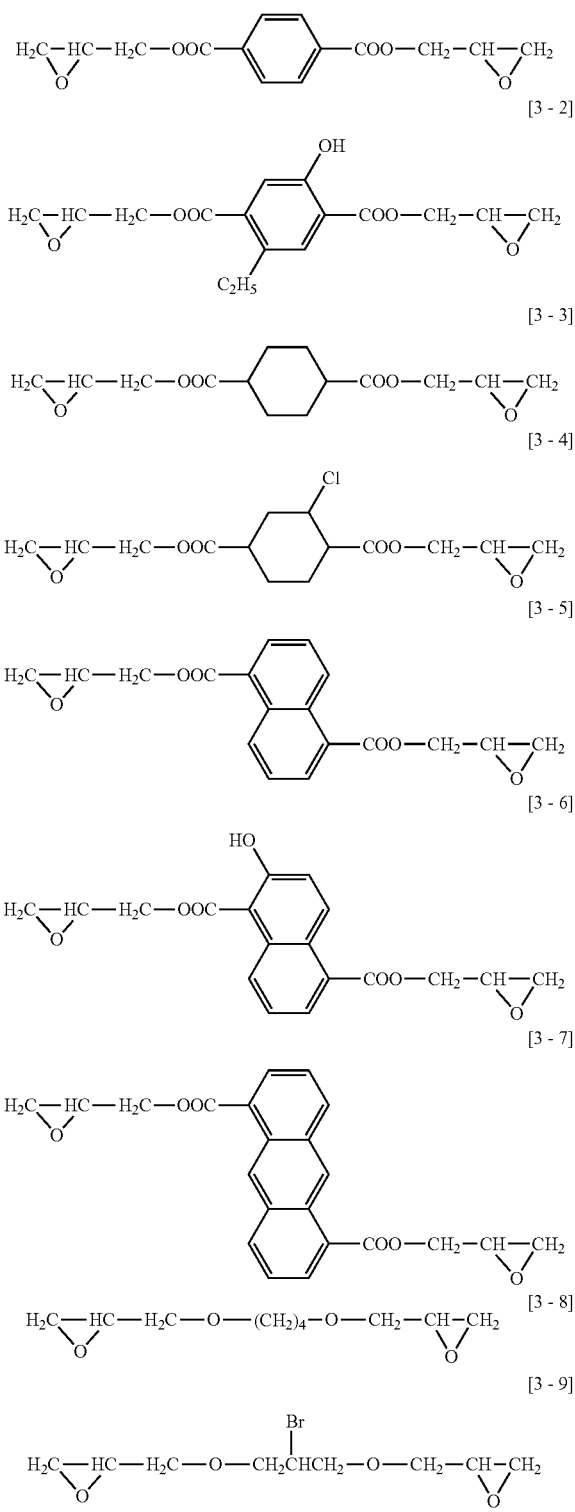

Examples of the dicarboxylic acid compounds include the above-mentioned dicarboxylic acid compounds.

As the organic polymer compound, a polymer compound having a weight average molecular weight of, for example, 1,000 to 1,000,000, or 3,000 to 300,000, or 5,000 to 200,000, or 10,000 to 100,000 can be used.

The organic polymer compound may be used alone or in combination.

The above-mentioned polymer (a) preferably has a structure of the following formula (2):

[Chemical formula 10]

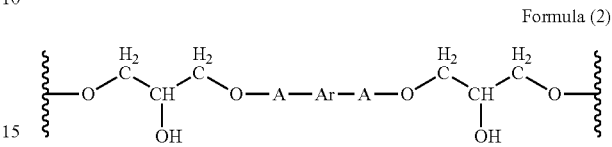

Formula (2)

wherein A represents a direct bond or —C(=O)—; and Ar represents a benzene, naphthalene or anthracene ring, which is optionally substituted with a $C_1$-$C_6$ alkyl group, a halogen atom, a hydroxyl group, a carboxyl group, an amino group, a $C_1$-$C_6$ alkoxy group, a $C_1$-$C_6$ alkylthio group, a cyano group, an acetyl group, an acetyloxy group, a $C_1$-$C_6$ alkoxycarbonyl group, a nitro group, a nitroso group, an amide group, an imide group, a $C_1$-$C_6$ alkoxysulfonyl group or a sulfonamide group.

Examples of alkyl groups include a methyl group, an ethyl group, a n-butyl group, a t-butyl group, an isopropyl group, and a cyclohexyl group, examples of halogen atoms include a fluorine atom, a chlorine atom, a bromine atom, and an iodine atom, examples of alkoxy groups include a methoxy group, an ethoxy group, and a butoxy group, examples of alkylthio groups include a methylthio group, an ethylthio group, and a butylthio group, examples of alkoxycarbonyl groups include a methoxycarbonyl group, an ethoxycarbonyl group, and an isopropoxycarbonyl group, and examples of alkoxysulfonyl groups include a methoxysulfonyl group and an ethoxysulfonyl group.

The above-mentioned polymer (a) can be produced by, for example, the method described in Japanese Patent No. 5,041,175.

2.2. (b) Solvent

In the present invention, as a solvent for solving the solid component, for example, ethylene glycol monomethyl ether, ethylene glycol monoethyl ether, methylcellosolve acetate, ethylcellosolve acetate, diethylene glycol monomethyl ether, diethylene glycol monoethyl ether, propylene glycol, propylene glycol monomethyl ether, propylene glycol monomethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, or butyl lactate can be used. These organic solvent may be used alone or in combination.

A high boiling-point solvent, such as propylene glycol monobutyl ether or propylene glycol monobutyl ether acetate, may be mixed with the organic solvent, and used.

Of these solvents, propylene glycol monomethyl ether, propylene glycol monomethyl ether acetate, ethyl lactate, butyl lactate, and cyclohexanone are preferred for improving the leveling properties.

2.3. Optional Components

2.3.1. Crosslinking Agent

It is preferred that, after having been applied, the resist underlayer film forming composition of the present invention is crosslinked upon baking for forming an antireflection film, in order to prevent the composition from intermixing with the photoresist applied onto the composition. The resist underlayer film forming composition of the present invention may further contain a crosslinking agent component. Examples of such crosslinking agents include melamine compounds having a crosslinking substituent, such as a methylol group or a methoxymethyl group, and substituted urea compounds. Such crosslinking agents are crosslinking agents having at least two crosslinking substituents, and include compounds, such as methoxymethylated glycoluril and methoxymethylated melamine. Preferred is tetramethoxymethylglycoluril or hexamethoxymethylmelamine. Further examples include such compounds as tetramethoxymethylurea and tetrabutoxymethylurea.

The amount of the crosslinking agent added may vary depending on, for example, the type of the application solvent used, the type or shape of the substrate used, or the difference of the properties required for the resist underlayer film. It ranges 0.001 to 20% by mass, preferably 0.01 to 15% by mass, further preferably 0.05 to 10% by mass, based on the mass of the composition. The crosslinking agent may undergo a self-condensation to cause a crosslinking reaction. It can cause a crosslinking reaction with the crosslinking substituent of the polymer (a) contained in the resist underlayer film forming composition of the present invention, for example, with the hydroxyl group in formula (2) above.

2.3.2. Crosslinking Catalyst

In the present invention, as a catalyst for accelerating the crosslinking reaction, an acid compound, such as p-toluenesulfonic acid, p-phenolsulfonic acid, trifluoromethanesulfonic acid, pyridinium p-toluenesulfonate, pyridinium p-phenolsulfonate, pyridinium trifluoromethanesulfonate, trifluoroacetic acid, sulfosalicylic acid, or citric acid, and/or a thermal acid generator, such as 2,4,4,6-tetrabromocyclohexadienone, benzoin tosylate, or 2-nitrobenzyl tosylate, may be incorporated. The amount of the crosslinking catalyst incorporated into the composition ranges usually 0.02 to 10% by mass, and preferably 0.04 to 5% by mass, in terms of solid content.

2.3.3. Crosslinking Resin

To the resist underlayer film forming composition of the present invention may further be added a resin having at least one crosslinking substituent selected from a hydroxyl group, a carboxyl group, an amino group, and a thiol group. Addition of such a resin permits controlling the properties of a resist underlayer film formed from the resist underlayer film forming composition of the present invention. Examples of such resins include those containing a structural unit derived from, for example, 2-hydroxyethyl acrylate, 2-hydroxypropyl acrylate, 2-hydroxyethyl methacrylate, 2-hydroxypropyl methacrylate, vinyl alcohol, 2-hydroxyethylvinyl ether, acrylic acid, or methacrylic acid. The resin may have a weight average molecular weight of 500 to 1,000,000, preferably 500 to 500,000. The amount of the resin contained in the resist underlayer film forming composition of the present invention is 20% by mass or less, preferably 15% by mass or less, in terms of solid content.

Examples of the resins include poly-2-hydroxyethyl methacrylate, polyvinyl alcohol, polyacrylic acid, a copolymer of 2-hydroxypropyl acrylate and methyl methacrylate, a copolymer of 2-hydroxypropyl acrylate and isopropyl methacrylate, a copolymer of 2-hydroxypropyl methacrylate and 2,2,2-trichloroethyl methacrylate, a copolymer of 2-hydroxypropyl methacrylate and 2,2,2-trifluoroethyl methacrylate, a copolymer of 2-hydroxypropyl methacrylate and 2-chloroethyl methacrylate, a copolymer of 2-hydroxypropyl methacrylate and cyclohexyl methacrylate, a copolymer of 2-hydroxypropyl methacrylate and normaloctyl methacrylate, a copolymer of 2-hydroxypropyl methacrylate and vinyl alcohol, a copolymer of 2-hydroxypropyl methacrylate and acrylic acid, a copolymer of 2-hydroxypropyl methacrylate and maleimide, a copolymer of 2-hydroxypropyl methacrylate and acrylonitrile, a copolymer of vinyl alcohol and methyl methacrylate, a copolymer of vinyl alcohol and maleimide, a copolymer of vinyl alcohol and methyl methacrylate, a copolymer of 2-hydroxyethylvinyl ether and ethyl methacrylate, a copolymer of 2-hydroxyethylvinyl ether and 2-hydroxypropyl methacrylate, a copolymer of methacrylic acid and ethyl methacrylate, and a copolymer of methacrylic acid and maleimide.

2.3.4. Photoacid Generator

A photoacid generator may be added to the resist underlayer film forming composition of the present invention, to make the acidity of the resist underlayer film consistent with that of the photoresist to be coated onto the resist underlayer film in the lithography step. Preferred examples of photoacid generators include onium salt photoacid generators, such as bis(4-t-butylphenyl)iodonium trifluoromethanesulfonate and triphenylsulfonium trifluoromethanesulfonate; halogen-containing compound photoacid generators, such as phenyl-bis(trichloromethyl)-s-triazine; and sulfonic acid photoacid generators, such as benzoin tosylate and N-hydroxysuccinimide trifluoromethanesulfonate. The amount of the photoacid generator added to the composition ranges 0.02 to 3% by mass, and preferably 0.04 to 2% by mass, in terms of solid content.

2.3.5. Light Absorbing Compound

A light absorbing compound may be further added to the resist underlayer film forming composition of the present invention. Addition of a light absorbing compound permits controlling the properties of a resist underlayer film formed from the resist underlayer film forming composition of the present invention. Any compound may be used as such a light absorbing compound, as far as the compound has a high absorbing power for a light in the photosensitivity characteristic wavelength region of the photosensitive component in the photoresist layer formed onto the resist underlayer film, and as far as it prevents the irregular reflection due to the standing waves caused by the reflection from the substrate or due to the steps on the surface of the substrate.

The light absorbing compound may be used alone or in combination. The amount of the light absorbing compound added to the resist underlayer film forming composition of the present invention is 0.01% by mass or more, and is 1 to 90% by mass, for example, 1 to 50% by mass, and, for example, 5 to 40% by mass, in terms of solid content.

As the light absorbing compound may be used, for example, a phenyl compound, a benzophenone compound, a benzotriazole compound, an azo compound, a naphthalene compound, an anthracene compound, an anthraquinone compound, a triazine compound, a triazinetrione compound, or a quinoline compound. A phenyl compound, a naphthalene compound, an anthracene compound, a triazine compound, or a triazinetrione compound may preferably be used.

A phenyl compound having at least one hydroxyl group, amino group, or carboxyl group, a naphthalene compound having at least one hydroxyl group, amino group, or carboxyl group, or an anthracene compound having at least one hydroxyl group, amino group, or carboxyl group may preferably be used.

2.3.5.1. Phenyl Compound

Examples of phenyl compounds having at least one hydroxyl group, amino group, or carboxyl group include phenol, bromophenol, 4,4'-sulfonyldiphenol, tert-butylphenol, biphenol, benzoic acid, salicylic acid, hydroxyisophthalic acid, phenylacetic acid, aniline, benzylamine, benzyl alcohol, cinnamyl alcohol, phenylalanine, and phenoxypropanol.

2.3.5.2. Naphthalene Compound

Examples of naphthalene compounds having at least one hydroxyl group, amino group, or carboxyl group include 1-naphthalenecarboxylic acid, 2-naphthalenecarboxylic acid, 1-naphthol, 2-naphthol, 1-aminonaphthalene, naphthylacetic acid, 1-hydroxy-2-naphthalenecarboxylic acid, 3-hydroxy-2-naphthalenecarboxylic acid, 3,7-dihydroxy-2-naphthalenecarboxylic acid, 6-bromo-2-hydroxynaphthalene, and 2,6-naphthalenedicarboxylic acid.

2.3.5.3. Anthracene Compound

Examples of anthracene compounds having at least one hydroxyl group, amino group, or carboxyl group include 9-anthracenecarboxylic acid, 9-hydroxymethylanthracene, and 1-aminoanthracene.

2.3.6. Other Optional Components

A further component other than the above-mentioned optional components, if necessary, for example, a rheology modifier or a surfactant, may be added to the resist underlayer film forming composition of the present invention.

2.3.6.1. Rheology Modifier

A rheology modifier is added mainly for the purpose of improving the fluidity of the resist underlayer film forming composition, particularly for improving filling of the inside of hole with the resist underlayer film forming composition in the baking step. Specific examples of rheology modifiers include phthalic acid derivatives, such as dimethyl phthalate, diethyl phthalate, diisobutyl phthalate, dihexyl phthalate, and butylisodecyl phthalate; adipic acid derivatives, such as dinormalbutyl adipate, diisobutyl adipate, diisooctyl adipate, and octyldecyl adipate; maleic acid derivatives, such as dinormalbutyl maleate, diethyl maleate, and dinonyl maleate; oleic acid derivatives, such as methyl oleate, butyl oleate, and tetrahydrofurfuryl oleate; and stearic acid derivatives, such as normalbutyl stearate and glyceryl stearate. The rheology modifier is incorporated usually in an amount of less than 30% by mass, based on the total mass of the composition for the antireflection film material for lithography.

2.3.6.2. Surfactant

A surfactant may be incorporated into the resist underlayer film forming composition of the present invention for further improving the application properties for avoiding surface unevenness and preventing occurrence of pinholes and striation. Examples of surfactants include nonionic surfactants, e.g., polyoxyethylene alkyl ethers, such as polyoxyethylene lauryl ether, polyoxyethylene stearyl ether, polyoxyethylene cetyl ether, and polyoxyethylene oleyl ether; polyoxyethylene alkylallyl ethers, such as polyoxyethylene octylphenol ether and polyoxyethylene nonylphenol ether; polyoxyethylene-polyoxypropylene block copolymers; sorbitan fatty acid esters, such as sorbitan monolaurate, sorbitan monopalmitate, sorbitan monostearate, sorbitan monooleate, sorbitan trioleate, and sorbitan tristearate; and polyoxyethylene sorbitan fatty acid esters, such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorine surfactants, such as EFTOP EF301, EF303, EF352 (manufactured by Tohchem Products Co., Ltd.), MEGAFACE F171, F173 (manufactured by DIC Corporation), Fluorad FC430, FC431 (manufactured by Sumitomo 3M), AsahiGuard AG710, and Surflon S-382, SC101, SC102, SC103, SC104, SC105, SC106 (manufactured by Asahi Glass Co., Ltd.), and organosiloxane polymer KP341 (manufactured by Shin-Etsu Chemical Co., Ltd.). The amount of the surfactant incorporated into the resist underlayer film forming composition of the present invention is usually 0.2% by mass or less, and preferably 0.1% by mass or less, based on the mass of the composition. These surfactant may be added alone or in combination.

3. Production of Semiconductor Device

A semiconductor device can be produced through the steps of: forming on a semiconductor substrate an underlayer film from the resist underlayer film forming composition of the present invention; forming a resist film on the underlayer film; irradiating the resist film with a light or an electron beam and subjecting the resultant resist film to development to form a resist pattern; etching the underlayer film with the resist pattern; and processing the semiconductor substrate using the patterned underlayer film.

3.1. Preparation of Resist Underlayer Film

A resist underlayer film can be formed by applying the resist underlayer film forming composition containing the additive of the present invention onto a semiconductor substrate in accordance with a conventional method and baking the applied composition. The formed resist pattern may be used in production of a semiconductor.

3.1.1. Substrate

The semiconductor substrate is typically a silicon wafer, but an SOI (silicon on insulator) substrate, or a compound semiconductor wafer, such as gallium arsenide (GaAs), indium phosphide (InP), or gallium phosphide (GaP), may be used. A semiconductor substrate having an insulating film formed thereon, such as a silicon oxide film, a nitrogen-containing silicon oxide film (SiON film), or a carbon-containing silicon oxide film (SiOC film), may be used. In this case, the resist underlayer film forming composition of the present invention is applied onto the insulating film.

3.1.2. Application

The application of the resist underlayer film forming composition of the present invention can be conducted by a method commonly used. The composition can be applied by an appropriate application method, for example, using a spinner or a coater.

3.1.3. Baking

The obtained applied film is baked to form a resist underlayer film. Baking conditions are appropriately selected from a baking temperature of 80 to 500° C., or 80 to 250° C., and a baking time of 0.3 to 60 minutes. Preferred are conditions at a baking temperature of 150 to 500° C. for a baking time of 0.5 to 2 minutes. The underlayer film formed has a thickness of, for example, 10 to 1,000 nm, or 20 to 500 nm, or 50 to 300 nm, or 100 to 200 nm, or 10 to 100 nm.

3.2. Formation of Resist Pattern

The resist underlayer film forming composition of the present invention may be applied to the lithography step in a production process for a semiconductor device. The lithography step comprises the sub-steps of: applying the resist underlayer film forming composition of the present invention onto a semiconductor substrate and baking the applied composition to form a resist underlayer film (see item 3 above); applying a resist onto the resist underlayer film and baking the resist to form a resist film; subjecting the semiconductor substrate coated with the resist underlayer film and the resist film to exposure; and subjecting the resist film after the exposure to development, to form a resist pattern on the resist underlayer film.

3.2.1. Formation of Resist Film

A photoresist film is formed on the above-obtained resist underlayer film, for example. The formation of the photoresist film can be performed by a known method, specifically by applying a photoresist composition solution onto the underlayer film and baking the applied solution.

There is no particular limitation as long as the photoresist for the film formed on the resist underlayer film of the present invention is sensitive to a light used in the exposure. Any of negative photoresists and positive photoresists may be used. There are, for example, a positive photoresist containing a novolak resin and 1,2-naphthoquinonediazidosulfonate; a chemical amplification photoresist containing a photoacid generator, and a binder having a group that is decomposable by an acid to increase the alkali solubility; a chemical amplification photoresist containing an alkali-soluble binder, a photoacid generator, and a low-molecular weight compound that is decomposable by an acid to increase the alkali solubility of the photoresist; and a chemical amplification photoresist containing a photoacid generator, a binder having a group that is decomposable by an acid to increase the alkali solubility, and a low-molecular weight compound that is decomposable by an acid to increase the alkali solubility of the photoresist. For example, the resist includes trade name: APEX-E, manufactured by Shipley Company, Inc.; trade name: PAR710, manufactured by Sumitomo Chemical Co., Ltd.; and trade name: SEPR430, manufactured by Shin-Etsu Chemical Co., Ltd. Further, it includes fluorine atom-containing polymer photoresists described in, for example, Proc. SPIE, Vol. 3999, 330-334 (2000), Proc. SPIE, Vol. 3999, 357-364 (2000), and Proc. SPIE, Vol. 3999, 365-374 (2000).

3.2.2. Exposure

Next, exposure through a predetermined mask is conducted. As a light source for the exposure, a KrF or ArF excimer laser is preferred. An EUV (wavelength: 13.5 nm) light or an electron beam may be used instead of a KrF or ArF excimer laser. The "EUV" is an abbreviation for extreme ultraviolet. The resist for forming a resist film may be either positive or negative. A KrF or ArF excimer laser is preferred. A chemical amplification resist sensitive to an EUV light or an electron beam may be used. After the exposure, if necessary, post exposure bake may be performed. The post exposure bake is performed under conditions appropriately selected from those at a baking temperature of 70 to 150° C. for a baking time of 0.3 to 10 minutes.

3.2.3. Development

Next, development using a developer is conducted. In the case a positive photoresist has been used, the exposed portion of the photoresist film is removed so as to form a photoresist pattern.

Examples of developers include alkaline aqueous solutions, e.g., aqueous solutions of an alkali metal hydroxide, such as potassium hydroxide or sodium hydroxide; aqueous solutions of a quaternary ammonium hydroxide, such as tetramethylammonium hydroxide, tetraethylammonium hydroxide, or choline; and aqueous solutions of an amine, such as ethanolamine, propylamine, or ethylenediamine. Further, for example, a surfactant may be added to the above developer. The conditions for the development are appropriately selected from a temperature of 5 to 50° C. and a period of time of 10 to 600 seconds.

3.2.4. Prevention of Resist Pattern Collapse

The resist pattern formed on the resist underlayer film containing the additive of the present invention has a wide collapse margin relative to the change of the exposure amount in the development process for the resist. That is, even when the exposure amount is changed, the resist pattern is unlikely to collapse.

This advantage mentioned above can be ascertained by determining by means of a critical dimension SEM the resist pattern dimension (pattern collapse critical dimension) with the maximum exposure amount (critical exposure amount) the resist pattern resists collapse, for example, as in the section of (Formation and evaluation of the resist pattern) in Examples below. Specifically, if a resist on a resist underlayer film containing the additive of the present invention shows a pattern collapse critical dimension 10 nm or more larger than that of a resist on a resist underlayer film without the additive of the present invention, then success of prevention of pattern collapse of a resist attributable to the additive of the present invention can be acknowledged.

3.2.5. Patterning

Following the patterning of the photoresist film, a portion of the resist underlayer film of the present invention, from which the photoresist film has been removed, is removed by dry etching so as to expose the semiconductor substrate. In dry etching for the resist underlayer film of the present invention, a gas, such as tetrafluoromethane ($CF_4$), perfluorocyclobutane ($C_4F_8$), perfluoropropane ($C_3F_8$), trifluoromethane, carbon monoxide, argon, oxygen, nitrogen, sulfur hexafluoride, difluoromethane, nitrogen trifluoride, chlorine trifluoride, chlorine, trichloroborane, or dichloroborane, may be used.

3.2.6. Processing of the Semiconductor Substrate

Finally, processing of the semiconductor substrate is conducted. The processing of the semiconductor substrate is preferably conducted by dry etching using a fluorine-based gas. Examples of fluorine-based gases include tetrafluoromethane ($CF_4$), perfluorocyclobutane ($C_4F_8$), perfluoropropane ($C_3F_8$), trifluoromethane, and difluoromethane ($CH_2F_2$).

Further, depending on the process conditions, the resist underlayer film formed from the resist underlayer film forming composition of the present invention can be used as a film having a function of preventing light reflection, as well as it can be used as a film further having a function of preventing an interaction between the substrate and the photoresist, a function of preventing an adverse action on the substrate by a material used in the photoresist or by a substance formed in the photoresist during the exposure for the photoresist, or a function of preventing an adverse effect on the photoresist by a substance generated from the substrate during the exposure or baking.

EXAMPLES

Hereinbelow, the present invention will be described in more detail with reference to the following Synthesis Examples and Examples, which should not be construed as limiting the scope of the present invention.

The weight average molecular weight of the polymer shown in Synthesis Example 1 below in the present description is the result of measurement by gel permeation chromatography (hereinafter, abbreviated to "GPC"). In the measurement, a GPC apparatus, manufactured by Tosoh Corp., is used, and the conditions for the measurement and others are as follows.

GPC column: Shodex [registered trademark]-Asahipak [registered trademark] (Showa Denko K.K.)
Column temperature: 40° C.
Solvent: N,N-Dimethylformamide (DMF)
Flow rate: 0.6 ml/minute
Standard sample: Polystyrene (Tosoh Corp.)

Synthesis Example 1

25.00 g of diglycidyl 1,4-terephthalate (product name: EX-711 [registered trademark], Nagase Chemtex Corporation), 14.46 g of 2,2-dimethylsuccinic acid, 1.60 g of ethyltriphenylphosphonium bromide, and 61.59 g of propylene glycol monomethyl ether were mixed together, and heated under reflux for 4 hours while stirring to obtain a polymer solution. To the obtained solution were added 41 g of a cation-exchange resin (product name: DOWEX [registered trademark] 550A, Muromachi Technos Co., Ltd.) and 41 g of an anion-exchange resin (product name: Amberlite [registered trademark] 15JWET, Organo Corporation), and the solution was subjected to ion-exchange treatment at room temperature for 4 hours. GPC analysis of the obtained polymer showed that the polymer had a weight average molecular weight of 4,000 in terms of standard polystyrene. The polymer obtained in this Synthesis Example corresponds to the resin binder contained in the resist underlayer film forming composition of the present invention.

Synthesis Example 2

3 g of glycidyl methacrylate, 26 g of 2-hydroxypropyl methacrylate, and 1.8 g of 2,2'-azobis(methyl isobutyrate) were dissolved in 46.4 g of propylene glycol monomethyl ether. The resultant solution was dropwise added in a nitrogen gas atmosphere to propylene glycol monomethyl ether separately heated to 90° C. The resultant mixture was stirred in a nitrogen gas atmosphere at 90° C. for 10 hours to obtain a polymer solution. Subsequently, 120 g of the obtained polymer solution, 2.5 g of 9-anthracenecarboxylic acid, and 0.1 g of benzyltriethylammonium bromide were dissolved in 10.2 g of propylene glycol monomethyl ether. The resultant solution was heated under reflux in a nitrogen gas atmosphere for 16 hours to obtain a reaction solution. To the reaction solution thus obtained were added 24 g of a cation-exchange resin (product name: DOWEX [registered trademark] 550A, Muromachi Technos Co., Ltd.) and 24 g of an anion-exchange resin (product name: Amberlite [registered trademark] 15JWET, Organo Corporation), and the solution was subjected to ion-exchange treatment at room temperature for 4 hours. GPC analysis of the obtained polymer showed that the polymer had a weight average molecular weight of 9,000 in terms of standard polystyrene.

Example 1

1.44 g of the polymer solution (resin binder) obtained in Synthesis Example 1 above, 0.08 g of tetramethoxymethylglycoluril, 0.01 g of pyridinium trifluoromethanesulfonate (manufactured by Tokyo Chemical Industry Co., Ltd.), 0.01 g of 1,3,4,6-tetrakis(2-hydroxyethyl)glycoluril (product name: TH-G, manufactured by Shikoku Chemicals Corporation) (compound represented by formula (1-1-1)), 7.50 g of propylene glycol monomethyl ether, and 0.96 g of propylene glycol monoethyl ether acetate were mixed together and dissolved to prepare a resist underlayer film forming composition of the present invention.

Example 2

2.04 g of the polymer solution (resin binder) obtained in Synthesis Example 1 above, 0.13 g of tetramethoxymethylglycoluril, 0.01 g of pyridinium trifluoromethanesulfonate (manufactured by Tokyo Chemical Industry Co., Ltd.), 0.02 g of 1,3,4,6-tetraallyltetrahydroimidazo[4,5-d]imidazole-2,5(1H,3H)-dione (compound represented by formula (1-1-2)), 11.36 g of propylene glycol monomethyl ether, and 1.44 g of propylene glycol monoethyl ether acetate were mixed together and dissolved to prepare a resist underlayer film forming composition of the present invention.

Example 3

1.44 g of the polymer solution (resin binder) obtained in Synthesis Example 1 above, 0.08 g of tetramethoxymethylglycoluril, 0.01 g of pyridinium trifluoromethanesulfonate (manufactured by Tokyo Chemical Industry Co., Ltd.), 0.01 g of 1,3,4,6-tetraallyl-3a,6a-dimethyltetrahydroimidazo[4,5-d]imidazole-2,5(1H,3H)-dione (compound represented by formula (1-1-3)), 7.50 g of propylene glycol monomethyl ether, and 0.96 g of propylene glycol monoethyl ether acetate were mixed together and dissolved to prepare a resist underlayer film forming composition of the present invention.

Example 4

2.04 g of the polymer solution (resin binder) obtained in Synthesis Example 1 above, 0.13 g of tetramethoxymethylglycoluril, 0.01 g of pyridinium trifluoromethanesulfonate (manufactured by Tokyo Chemical Industry Co., Ltd.), 0.02 g of 1,3,4,6-tetrakis(2-mercaptoethyl)glycoluril (compound represented by formula (1-1-4)), 11.36 g of propylene glycol monomethyl ether, and 1.44 g of propylene glycol monoethyl ether acetate were mixed together and dissolved to prepare a resist underlayer film forming composition of the present invention.

Comparative Example 1

1.49 g of the polymer solution (resin binder) obtained in Synthesis Example 1 above, 0.09 g of tetramethoxymethylglycoluril, 0.01 g of pyridinium trifluoromethanesulfonate (manufactured by Tokyo Chemical Industry Co., Ltd.), 7.45 g of propylene glycol monomethyl ether, and 0.96 g of propylene glycol monoethyl ether acetate were mixed together and dissolved to prepare a resist underlayer film forming composition of the present invention. This Comparative Example is an example in which the additive of the present invention is not contained.

Reference Example 1

1.49 g of the polymer solution (resin binder) obtained in Synthesis Example 1 above, 0.09 g of 1,3,4,6-tetrakis(2-hydroxyethyl)glycoluril (product name: TH-G, manufactured by Shikoku Chemicals Corporation) (compound represented by formula (1-1-1)), 0.01 g of pyridinium trifluoromethanesulfonate (manufactured by Tokyo Chemical Industry Co., Ltd.), 7.45 g of propylene glycol monomethyl ether, and 0.96 g of propylene glycol monoethyl ether acetate were mixed together and dissolved to prepare a resist underlayer film forming composition of the present invention. This comparative example is an example in which the crosslinking agent in the present invention is not contained.

Reference Example 2

1.56 g of the polymer solution (resin binder) obtained in Synthesis Example 2 above, 0.07 g of 1,3,4,6-tetrakis(2-hydroxyethyl)glycoluril (product name: TH-G, manufactured by Shikoku Chemicals Corporation) (compound represented by formula (1-1-1)), 0.01 g of pyridinium paratoluenesulfonate (manufactured by Tokyo Chemical Industry Co., Ltd.), 5.48 g of propylene glycol monomethyl ether, and 2.89 g of propylene glycol monoethyl ether acetate were mixed together and dissolved to prepare a resist underlayer film forming composition of the present invention. This comparative example is an example in which the crosslinking agent in the present invention is not contained.

Reference Example 3

1.56 g of the polymer solution (resin binder) obtained in Synthesis Example 2 above, 0.07 g of 1,3,4,6-tetraallyltetrahydroimidazo[4,5-d]imidazole-2,5(1H,3H)-dione (compound represented by formula (1-1-2)), 0.01 g of pyridinium paratoluenesulfonate (manufactured by Tokyo Chemical Industry Co., Ltd.), 5.48 g of propylene glycol monomethyl ether, and 2.89 g of propylene glycol monoethyl ether acetate were mixed together and dissolved to prepare a resist underlayer film forming composition of the present invention. This comparative example is an example in which the crosslinking agent in the present invention is not contained.

Reference Example 4

1.56 g of the polymer solution (resin binder) obtained in Synthesis Example 2 above, 0.07 g of 1,3,4,6-tetraallyl-3a,6a-dimethyltetrahydroimidazo[4,5d]imidazole-2,5(1H,3H)-dione (compound represented by formula (1-1-3)), 0.01 g of pyridinium paratoluenesulfonate (manufactured by Tokyo Chemical Industry Co., Ltd.), 5.48 g of propylene glycol monomethyl ether, and 2.89 g of propylene glycol monoethyl ether acetate were mixed together and dissolved to prepare a resist underlayer film forming composition of the present invention. This comparative example is an example in which the crosslinking agent in the present invention is not contained.

Reference Example 5

1.56 g of the polymer solution (resin binder) obtained in Synthesis Example 2 above, 0.07 g of 1,3,4,6-tetrakis(2-mercaptoethyl)glycoluril (compound represented by formula (1-1-4)), 0.01 g of pyridinium paratoluenesulfonate (manufactured by Tokyo Chemical Industry Co., Ltd.), 5.48 g of propylene glycol monomethyl ether, and 2.89 g of propylene glycol monoethyl ether acetate were mixed together and dissolved to prepare a resist underlayer film forming composition of the present invention. This comparative example is an example in which the crosslinking agent in the present invention is not contained.

Comparative Reference Example 1

1.56 g of the polymer solution (resin binder) obtained in Synthesis Example 2 above, 0.07 g of tetramethoxymethylglycoluril, 0.01 g of pyridinium paratoluenesulfonate (manufactured by Tokyo Chemical Industry Co., Ltd.), 5.48 g of propylene glycol monomethyl ether, and 2.89 g of propylene glycol monoethyl ether acetate were mixed together and dissolved to prepare a resist underlayer film forming composition of the present invention. This Comparative Example is an example in which the additive of the present invention is not contained.

(Dissolution Test in Photoresist Solvent)

Each of the resist underlayer film forming compositions prepared in Examples 1 to 4, Comparative Example 1, Reference Examples 1 to 5, and Comparative Reference Example 1 was applied by a spinner onto a silicon wafer, which is a semiconductor substrate. The resultant silicon wafer was placed on a hotplate and baked at 150° C. or 215° C. for one minute to form a resist underlayer film. The formed resist underlayer film was immersed in propylene glycol monomethyl ether (PGME)/propylene glycol monomethyl ether acetate (PGMEA) (7/3 in mass ratio) to determine whether the film was insoluble in the solvent.

TABLE 1

|  | Baking temperature (° C.) | Initial thickness (nm) | Thickness after immersion (nm) | Thickness change (nm) | Residual film ratio (%) |
| --- | --- | --- | --- | --- | --- |
| Example 1 | 215 | 97.4 | 97.5 | 0.1 | 100 |
| Example 2 | 215 | 100.4 | 100.5 | 0.2 | 100 |
| Example 3 | 215 | 98.4 | 98.4 | 0.0 | 100 |
| Example 4 | 215 | 100.0 | 100.0 | 0.0 | 100 |
| Comparative Example 1 | 215 | 111.9 | 111.9 | 0.0 | 100 |
| Reference Example 1 | 215 | 119.6 | 12.5 | 107.0 | 10 |
| Reference Example 2 | 150 | 128.8 | 5.6 | 123.2 | 4 |
| Reference Example 3 | 150 | 105.7 | 6.4 | 99.3 | 6 |
| Reference Example 4 | 150 | 110.6 | 6.5 | 104.1 | 6 |
| Reference Example 5 | 150 | 125.9 | 6.1 | 119.8 | 5 |
| Comparative Reference Example 1 | 150 | 119.2 | 119.2 | 0.0 | 100 |

The results shown in Table 1 revealed that all the resist underlayer films formed using the resist underlayer film forming compositions in Examples 1 to 4 of the present invention, Comparative Example 1, and Comparative Reference Example 1 had a thickness change of 1 nm or less (which is 1% or less of the initial thickness) and thus had a solvent resistance. In contrast, the results showed that the resist underlayer films formed using the resist underlayer film forming compositions in Reference Examples 1 to 5 did not have a solvent resistance. That is, the results confirmed that the additive of the present invention contained in the resist underlayer film forming composition in Example 1 is unlikely to undergo a crosslinking reaction.

(Formation and Evaluation of the Resist Pattern)

Each of the resist underlayer film forming compositions prepared in Examples 1 to 4 and Comparative Example 1 in the present description was spin-coated on a silicon wafer so as to have a film thickness of 10 nm, and baked at 215° C. for 60 seconds to form a resist underlayer film. A resist solution for KrF excimer laser (product name: SEPR-430, manufactured by Shin-Etsu Chemical Co., Ltd.) was spin-coated on the formed resist underlayer film, baked at 100° C. for 90 seconds, and subjected to exposure using an exposure apparatus for KrF excimer laser (NSR-S205C, manufactured by Nikon Corporation) under predetermined conditions. After the exposure, the resultant film was baked at 110° C. for 90 seconds (PEB), cooled to room temperature on a cooling plate, and subjected to development and rinsing treatment, to form a resist pattern.

An intended line width was a line-and-space of 170 nm (line: 170 nm; space: 170 nm), and, for studying the relationship between the occurrence of resist pattern collapse and the exposure amount change at the optimum focus, a resist pattern dimension (pattern collapse critical dimension) with the maximum exposure amount (critical exposure amount) the resist pattern resists collapse was determined by means of a critical dimension SEM. Thereby, it is possible to determine whether the use of the additive of the present invention prevents the resist pattern from collapsing in a high exposure amount region, making it possible to form a very fine resist pattern.

Table 2 below shows a critical exposure amount and a pattern collapse critical dimension of the obtained resist pattern. The larger the value of the critical exposure amount or the smaller the value of the pattern collapse critical dimension, the more preferable. A larger critical exposure amount and a smaller pattern collapse critical dimension reveals that the resist pattern is more unlikely to collapse, which indicates that high adhesion between the resist underlayer film and the resist pattern can be provided.

TABLE 2

| Resist underlayer film forming composition | Critical exposure amount | Pattern collapse critical dimension |
| --- | --- | --- |
| Example 1 | 32 mJ/cm$^2$ | 150 nm |
| Example 2 | >36 mJ/cm$^2$ | <140 nm |
| Example 3 | >36 mJ/cm$^2$ | <140 nm |
| Example 4 | 32 mJ/cm$^2$ | 155 nm |
| Comparative Example 1 | 29 mJ/cm$^2$ | 170 nm |

Table 2 shows that the resist underlayer films formed using the resist underlayer film forming compositions in Examples 1 to 4 containing the additive of the present invention exhibited a higher critical exposure amount and a smaller pattern collapse critical dimension than did the resist underlayer film formed using the resist underlayer film forming composition in Comparative Example 1. The results demonstrated that the additive of the present invention contained in the resist underlayer film forming compositions in Examples 1 to 4 improved the adhesion between the resist and the resist underlayer film and that the additive provided advantageous effects of preventing the resist pattern from collapsing.

Hereinabove, the embodiments of the present invention were described; however, the technical scope of the present invention is not limited to the range described in the above embodiments. One of ordinary skill in the art would be able to make various changes or modifications on the above-mentioned embodiments.

INDUSTRIAL APPLICABILITY

In the present invention, there can be provided a resist underlayer film forming composition, of which the function of preventing the resist pattern formed on a substrate from suffering pattern collapse in a lithography process for producing a semiconductor device is enhanced due to a compound additive having a glycoluril skeleton, and a resist underlayer film using the composition and a method for producing a semiconductor device.

The invention claimed is:

1. A resist underlayer film forming composition comprising a polymer, a solvent, a crosslinking agent, a crosslinking catalyst, and an additive, wherein
    the polymer is an organic polymer comprising an aromatic ring structure selected from the group consisting of a benzene ring, a naphthalene ring, an anthracene ring, a triazine ring, a quinolone ring, and a quinoxaline ring, and
    the additive comprises a compound represented by formula (1-1):

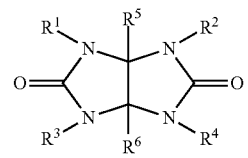

Formula (1-1)

wherein each of $R^1$ to $R^4$, which may be the same or different, is a $C_2$-$C_{10}$ alkenyl group or a $C_2$-$C_{10}$ alkyl group substituted with at least one substituent selected from the group consisting of a hydroxyl group, a thiol group, a carboxyl group, a $C_1$-$C_5$ alkoxyethyl group, a $C_1$-$C_5$ alkylsulfanyl group and an organic group having an ester linkage; and each of $R^5$ and $R^6$, which may be the same or different, represents a hydrogen atom or a group selected from a $C_1$-$C_{10}$ alkyl group and a phenyl group, wherein the additive does not function as a crosslinking agent.

2. The composition according to claim 1, wherein each of $R^1$ to $R^4$ is a $C_2$-$C_{10}$ alkenyl group or a $C_2$-$C_{10}$ alkyl group substituted with a hydroxyl group or a thiol group.

3. The composition according to claim 1, wherein the polymer has a structure of formula (2):

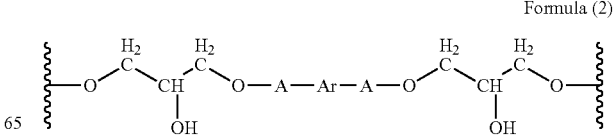

Formula (2)

wherein A represents a direct bond or —C(=O)—; and
Ar represents a benzene, naphthalene or anthracene ring, which is optionally substituted with a $C_1$-$C_6$ alkyl group, a halogen atom, a hydroxyl group, a carboxyl group, an amino group, a $C_1$-$C_6$ alkoxy group, a $C_1$-$C_6$ alkylthio group, a cyano group, an acetyl group, an acetyloxy group, a $C_1$-$C_6$ alkoxycarbonyl group, a nitro group, a nitroso group, an amide group, an imide group, a $C_1$-$C_6$ alkoxysulfonyl group or a sulfonamide group.

4. A resist underlayer film comprising the composition according to claim 1.

5. A method for forming a resist pattern for use in production of a semiconductor, the method comprising the step of applying the resist underlayer film forming composition according to claim 1 onto a semiconductor substrate and baking the applied composition to form a resist underlayer film.

6. A method for producing a semiconductor device, comprising the steps of: forming on a semiconductor substrate an underlayer film from the resist underlayer film forming composition according to claim 1; forming a resist film on the underlayer film; irradiating the resist film with a light or an electron beam and subjecting the resultant resist film to development to form a resist pattern; etching the underlayer film with the resist pattern; and processing the semiconductor substrate using the patterned underlayer film.

7. A method for preventing resist pattern collapse, comprising including an additive in a composition comprising a polymer, a solvent, a crosslinking agent, and a crosslinking catalyst to prepare a resist underlayer film, wherein the polymer is an organic polymer comprising an aromatic ring structure selected from the group consisting of a benzene ring, a naphthalene ring, an anthracene ring, a triazine ring, a quinolone ring, and a quinoxaline ring, and the additive comprises a compound represented by formula (1-1):

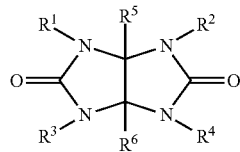

Formula (1-1)

wherein each of $R^1$ to $R^4$, which may be the same or different, is a $C_2$-$C_{10}$ alkenyl group or a $C_2$-$C_{10}$ alkyl group substituted with at least one substituent selected from the group consisting of a hydroxyl group, a thiol group, a carboxyl group, a $C_1$-$C_5$ alkoxyethyl group, a $C_1$-$C_5$ alkylsulfanyl group and an organic group having an ester linkage; and each of $R^5$ and $R^6$, which may be the same or different, represents a hydrogen atom or a group selected from a $C_1$-$C_{10}$ alkyl group and a phenyl group, wherein the additive does not function as a crosslinking agent.

8. A method for forming a resist underlayer film, comprising the step of applying the resist underlayer film forming composition according to claim 1 onto a semiconductor substrate and baking the applied composition.

9. The composition according to claim 2, wherein the polymer has a structure of formula (2):

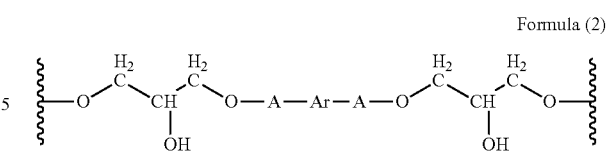

Formula (2)

wherein A represents a direct bond or —C(=O)—; and
Ar represents a benzene, naphthalene or anthracene ring, which is optionally substituted with a $C_1$-$C_6$ alkyl group, a halogen atom, a hydroxyl group, a carboxyl group, an amino group, a $C_1$-$C_6$ alkoxy group, a $C_1$-$C_6$ alkylthio group, a cyano group, an acetyl group, an acetyloxy group, a $C_1$-$C_6$ alkoxycarbonyl group, a nitro group, a nitroso group, an amide group, an imide group, a $C_1$-$C_6$ alkoxysulfonyl group or a sulfonamide group.

10. A resist underlayer film comprising the composition according to claim 2.

11. A method for forming a resist pattern for use in production of a semiconductor, the method comprising the step of applying the resist underlayer film forming composition according to claim 2 onto a semiconductor substrate and baking the applied composition to form a resist underlayer film.

12. A method for producing a semiconductor device, comprising the steps of: forming on a semiconductor substrate an underlayer film from the resist underlayer film forming composition according to claim 2; forming a resist film on the underlayer film; irradiating the resist film with a light or an electron beam and subjecting the resultant resist film to development to form a resist pattern; etching the underlayer film with the resist pattern; and processing the semiconductor substrate using the patterned underlayer film.

13. A method for preventing resist pattern collapse, comprising including an additive in a composition comprising a polymer, a solvent, a crosslinking agent, and a crosslinking catalyst to prepare a resist underlayer film, wherein the polymer is an organic polymer comprising an aromatic ring structure selected from the group consisting of a benzene ring, a naphthalene ring, an anthracene ring, a triazine ring, a quinolone ring, and a quinoxaline ring, and the additive comprises a compound represented by formula (1-1):

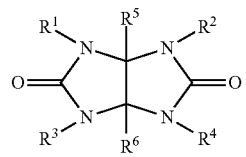

Formula (1-1)

wherein each of $R^1$ to $R^4$, which may be the same or different, is a $C_2$-$C_{10}$ alkenyl group or a $C_2$-$C_{10}$ alkyl group substituted with a hydroxyl group or a thiol group; and each of $R^5$ and $R^6$, which may be the same or different, represents a hydrogen atom or a group selected from a $C_1$-$C_{10}$ alkyl group and a phenyl group, wherein the additive does not function as a crosslinking agent.

14. A method for forming a resist underlayer film, comprising the step of applying the resist underlayer film forming composition according to claim 2 onto a semiconductor substrate and baking the applied composition.

* * * * *